United States Patent [19]

Konermann et al.

[11] Patent Number: 5,557,857
[45] Date of Patent: Sep. 24, 1996

[54] APPARATUS FOR THE AFTERTREATMENT OF PHOTOPOLYMERIZABLE PRINTING PLATES

[75] Inventors: Herbert Konermann; Reinhard Helmer, both of Lengerich, Germany

[73] Assignee: E. I. Du Pont de Nemours and Company, Wilmington, Del.

[21] Appl. No.: 117,849

[22] Filed: Sep. 7, 1993

[30] Foreign Application Priority Data

Sep. 17, 1992 [DE] Germany .......................... 42 31 104.7

[51] Int. Cl.⁶ .................................................. F26B 11/18
[52] U.S. Cl. .............................. 34/189; 34/190; 354/300; 354/334
[58] Field of Search ...................... 34/189, 190; 354/300, 354/334

[56] References Cited

U.S. PATENT DOCUMENTS 712,662  11/1902  Evers et al. ............................ 34/189 X
1,739,505  12/1929  Cunningham .......................... 34/189 X
4,259,002  3/1981  Thawley et al. ........................ 354/319

FOREIGN PATENT DOCUMENTS 0225678  6/1987  European Pat. Off. .
3004735  8/1980  Germany .

Primary Examiner—Henry A. Bennett
Assistant Examiner—Dinnatia Doster
Attorney, Agent, or Firm—Thomas H. Magee

[57] ABSTRACT

An apparatus for the aftertreatment of photopolymerizable printing plates with means for generating an environment with at least one predetermined condition and a transport device to carry the plates during and for transport of the plates through the apparatus. By uncoupling the transport velocity from the prior process steps, such an apparatus enables in-line aftertreatment. The transport device has multiple orbiting pallets on a type of continuous elevator conveyed at least section-wise through the environment.

39 Claims, 3 Drawing Sheets

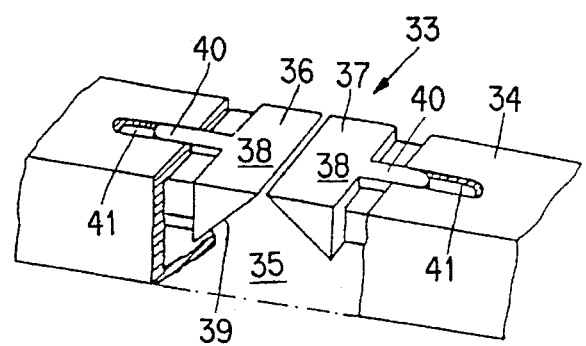
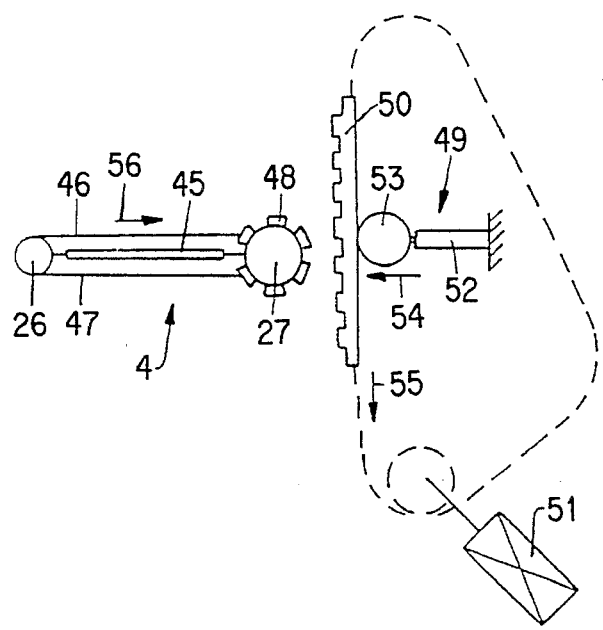
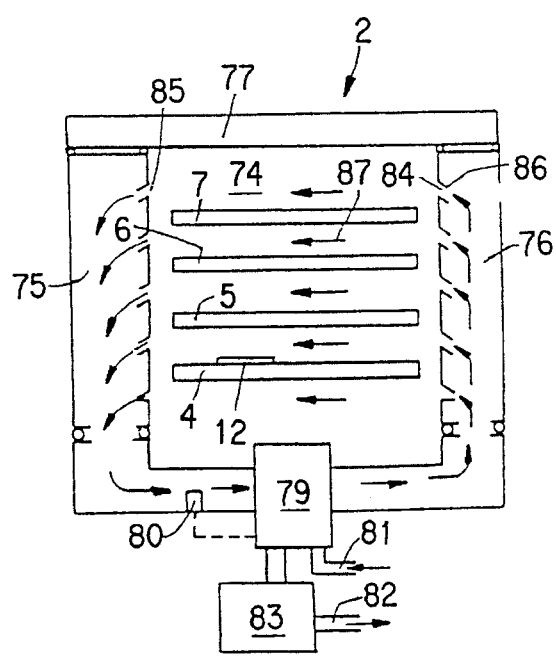

APPARATUS FOR THE AFTERTREATMENT OF PHOTOPOLYMERIZABLE PRINTING PLATES

BACKGROUND OF THE INVENTION

1. Field of the Invention

The invention involves an apparatus for the aftertreatment of photopolymerizable printing plates with means to produce an environment with at least one predetermined condition and a transport device to bear the printing plates and to transport them through the apparatus.

2. Description of Related Art

Photopolymerizable printing plates are washed off after exposure, which polymerizes the exposed or unexposed areas, depending on the plate composition. Washoff removes the unpolymerized components of the printing plate. After washoff, the printing plates, which are sometimes also called stereotypes, usually have some residual moisture and residual tackiness, which must be removed in subsequent aftertreatments.

For example, EP 0 225 678 discloses blowing warm drying air over the printing plates after washoff and then positioning them for heat treatment. This aftertreatment occurs in the same apparatus where the washoff was conducted, that is, the printing plates have essentially the same velocity in drying as in washoff. As drying usually requires essentially more time than washoff, this results in a series of contradictory requirements. To be able to conduct the aftertreatment with the necessary care, the apparatus must be large enough for the plates to spend sufficient time in the apparatus. On the other hand, the apparatus must not exceed a size determined by cost and space considerations. Shortening the aftertreatment time or lengthening washoff time usually leads to unsatisfactory compromise solutions.

DE 30 04 735 A1 discloses an apparatus for simultaneously treating the surfaces of several printing plates, wherein the several printing plates are first collected on a carriage that has a series of carriers arranged one above the other. The loaded carriage is conveyed into the apparatus and remains there for a predetermined aftertreatment time in a first section. Then it is conveyed into a second section, where it remains similarly for a predetermined second treatment time. However, the batchwise loading of the apparatus has the disadvantage that not all of the printing plates can be treated immediately after the washoff process. Residual washoff liquid can remain active on the plates, whereby the desired result, specifically a printing plate with a predetermined relief, is undesirably modified. Furthermore, the disclosed apparatus requires additional plate handling, which hinders automating plate production, and requires space to collect the plates.

SUMMARY OF THE INVENTION

The problem involved in the invention is to provide an aftertreatment apparatus for photopolymerizable printing plates that, by uncoupling the treatment time from prior process steps, enables the use of an in-line operation.

This problem is solved by an apparatus of the type cited in the introduction in which the transport device has several orbiting pallets for printing plates that are conveyed at least sectionwise through the environment.

The pallets are arranged as a type of endless, multistage elevator. A printing plate can be laid on a pallet in one place and lifted from the pallet in another place. The aftertreatment time is then dependent only on how fast the pallet is moved from the first to the second place. This time can be selected independently of the duration of prior process steps, such as washoff. As they are delivered from the prior process steps, the printing plates can be accepted into the apparatus and there treated further. Waiting times outside the apparatus, as formerly needed to collect plates, are not required. An additional collection space is omitted.

The orbit comprises preferably several straight line sections running essentially horizontal or vertical. The pallets must be conveyed only linearly in the individual sections, thus simplifying the drive. The construction of the apparatus is simplified by this measure. For example, the housing walls of the apparatus are formed by panels interconnected at right angles.

It is desirable for the pallets to essentially retain their spatial orientation during the entire orbit. In other words, a surface of the pallet pointing up in any location remains always so oriented. Printing plates placed on this surface thus maintain their placement and cannot fall off the pallet. This has the special advantage that, by maintaining their orientation, the pallets are stacked above one another or behind one another, the former being preferred. This permits handling relatively thick plates that are held on the pallets by gravity. The relatively thick printing plate simplifies the size of the apparatus. Feeding the plates to and removing them from the apparatus can be standardized. The printing plates are fed into and removed from the apparatus in the same orientation, for example, with the image side up.

The orbit can also be advantageously closed outside the apparatus. In this case, the section outside the apparatus does not involve plate treatment. It serves only to return empty pallets.

It is advantageous to provide separate drives for the pallets in the horizontal and vertical sections of the orbit. Pallet velocity can then be different in the horizontal and vertical sections. For example, in the vertical sections, pallet travel one above and parallel to each other can be relatively slow. Longitudinal pallet travel in the horizontal sections can be more rapid so that pallet movement in the orbit is not slowed by the lateral movement in the horizontal sections. Moreover, separating the drives simplifies pallet travel control.

Preferred drives have circulating belts with attached dogs to engage lateral projections on the pallets. The term "belts" includes all means of exerting traction on the pallets, such as chains, toothed or V-belts, cords, cables, and the like. Such belts are circulated in a loop with at least one guide roller. Controlling the guide roller can control pallet travel in the appropriate section.

In the horizontal sections, it is advantageous for the pallets to travel with their projections in a guide interrupted by the drives for the vertical sections; at least three projections are provided and the guide accepts a tilt moment. While the pallets are carried in the vertical sections of the orbit by the dogs, which, besides being a drive, also act as a bearing or support for the pallets, the pallets are passed into the horizontal sections on a guide. This guide, however, must not be a continuous structure. It is interrupted by the drives for the vertical sections. The pallets must ride over these gaps. At least three projections are provided for this purpose. One projection can easily pass over the gap in the guide, in which case the two other projections remaining in the guide prevent the pallet from tipping despite the missing support of this projection. It is necessary for the guide to be able to accept this tipping moment. When the first projection has passed over the gap, the pallet can no longer tip, because it is then held by the first and last projection. When the last projection has passed over the gap, at least two projections have already been picked up by the guide and thus prevent the pallet from tipping in the other direction. Thus, despite the gap in the guide for the vertical drives, horizontal pallet travel can be achieved.

The preferred guide has U-profiles located on opposite sides of the pallet. A U-profile, which in the present case is lateral, can sustain on both its arms ascending or descending projections, that is, block movement of the projections in both directions. This achieves in a simple manner the guide accepting the required tilt moment. A small tilt movement by the pallet can be essentially avoided by a corresponding adaptation of the free cross-section of the U to the cross-section of the projections.

It is advantageous for the guide to have for the upper horizontal section a latch mechanism that opens for the through passage of the projections and closes afterwards. This can allow, on one hand, the pallet to be forwarded through the guide from below, but, on the other hand, produces, after the passage of the latch mechanism, a support on which the pallet can be transported further horizontally.

Two latch mechanisms and two associated projections, with the center of gravity in between, are preferred for each pallet side. Thus, the pallet can lie after the latch mechanism passes without tipping in either direction. These two projections are positioned preferably on each of the two sides between two other projections that engage the dogs of the vertical drive device. Thus, each side of the pallet has four projections, a feature that further simplifies passage over the gaps in the guide.

It is advantageous for the vertical drive to be reversible, and a control is provided to reverse the vertical drive momentarily after the projection has passed the latch mechanism. The latch mechanism can therefore close unaffected by the pallet and make available the carrying surface for the pallet, without having to exercise force on the pallet in the closing movement. The vertical drive reverses just after the closing of the latch mechanism occurring after the passage of the pallet and thereby places the pallet on the guide.

This is especially advantageous if the vertical drives have for each pallet side at least two dogs with a V-shaped cross-section and the projections have a cross-section in which the deepest point is approximately in the horizontal center. Then the projections are held more securely by the dogs. Sideward travel of the pallet, thus travel in the horizontal direction, is excluded during vertical travel. However, the projections are freed by the reversal of the vertical drive so that the pallets can then be shifted horizontally without problems.

It is advantageous for the latch mechanism to be controllable. Thus, it can be opened to let each pallet pass through and closed to bar the opening and to make available a closed guide. Such control is particularly helpful when the pallets descend.

The control can be effected by the pallets themselves by a preferred embodiment of the latch mechanism having at least one bevel against which the projection exerts pressure in its vertical travel. The bevel converts this pressure into a horizontal force that opens the latch mechanism. Thus, the ascending pallet opens its through passage itself.

More than three projections are preferred on each pallet side with the spacing between the outer projections and the next inner ones being different from the other projection spacings. Such a configuration is especially advantageous if a latch mechanism is not provided for descending pallets, but the pallets are shifted to upward travel on the guide simply on the dogs. In this case, openings can be available in the guide for those projections that are operated by the latch mechanism in upward travel. Because of the unequal spacings between the individual projections, the pallet cannot prematurely, that is, with projections not provided for this purpose, fall through these openings, because the spaces between the openings and the projections do not coincide. The pallet is thus held on the guide until it meshes with the dogs for downward travel.

The preferred vertical drive for descending pallets has a control that, in horizontal travel of the pallets, holds the dog somewhat in the top of the guide and initiates descent only when the projections mesh with the corresponding dogs. In this case, a latch mechanism for downward travel can be omitted.

It is advantageous for the upper side of the latch mechanism to form a slide surface with the guide. When the latch mechanism is closed, the pallet can be directed over the latch mechanism without travel being hindered by steps or notches.

The preferred latch mechanism has a latch, the top side of which is accepted finger-like within the guide. The projection is thus supported either by the latch or the slide surface or, in a partial section, by both.

A preferred embodiment of the apparatus has a drying chamber that can be closed off by doors. In the drying chamber, the plates are warmed and/or subjected to an air flow so that residual moisture is evaporated from the plate.

The dryer advantageously has a device to produce an air flow perpendicular to the pallets. Such an air flow, which also can be heated, spreads over the surface of the printing plates, thereby achieving improved drying. The air flow entrains and removes the evaporated moisture so that it cannot recondense on the printing plates. The air flow generator can be, for example, a fan with attached air ducts.

The preferred air flow generator produces opposing air flows in the drying chamber. This causes countercurrent flow that, possibly by creating turbulence, contributes to improved contact between the surface of the plates and the drying air. Drying can thus be, for example, faster or more intensive.

It is advantageous to have the doors form a path for the air flow. When the doors are open, for example, for maintenance, the air flow is automatically interrupted so that the interior of the drying chamber is safely accessible. In addition, the path through the open doors is more easily accessible for convenient maintenance and inspection than in a closed housing.

The preferred doors have air outlet slots at predetermined levels, the slots having various flow resistances with magnitudes depending upon the distance from the fan generating the air flow. In this manner, the air exhaust velocity is equal in all of the air outlet slots. Thus, the pallets are subjected to the same air flow regardless of their travel location, so that the drying process is very uniform and of constant duration in the entire circuit through the dryer.

It is desirable for the air outlet slots to be adjustable. This permits fine adjustment of flow resistance in the outer slots. In addition, stronger or weaker air flow can be set at any location, if necessary.

The air outlet slots are advantageously positioned between the standby positions of the pallets. The standby positions are the positions in which the pallets remain while a pallet is loaded or another pallet changes from vertical travel to horizontal travel or travels horizontally. The pallets remain in such a position the greatest part of the time within which the printing plates are conveyed through the apparatus. Positioning the air outlet slots between these standby positions of the pallets produces air flows that spread relatively unhindered between the individual pallets. This yields high air velocities and thereby, good drying performance. If high air velocities are not wanted, air flow production can be reduced. Both of these effects are advantageous.

In an especially advantageous embodiment, the air flow is recirculated air. A sensing device measures the air flow content of materials dried off the printing plates and controls the addition of fresh air accordingly. This keeps the environmental impact relatively low. The air flow is provided with fresh air, if the air flow is too heavily loaded with materials evaporated or volatilized from the printing plates to assure satisfactory drying of the printing plates. This minimizes odor outside the apparatus.

This embodiment can be improved by exhaust purification. If fresh air is added, a corresponding amount of air must be removed from the air flow and circulated into a bypass flow. The air removed is cleaned in exhaust purification so that only purified air is released from the apparatus. The purified air can also be added as fresh air so that the air in the bypass flow is cleaned continuously, optionally controlled by a sensor.

Another advantageous embodiment incorporates a postexposure unit in the apparatus. The unit has a light source with a predetermined spectrum that can be optionally varied periodically, the light source being located in a storage chamber. The light source irradiates one or more printing plates. This hardens the plates and/or eliminates residual tackiness. For example, residual tackiness of the plates can be eliminated with UV-C (about 250 nm), and complete polymerization of the printing plate material occurs with UV-A (about 370 nm). The times for producing either wavelength can be determined by experience or controlled as a function of the actual condition of the plates. The postexposure unit also forms a storage chamber, that is, the postexposed printing plates do not all have to be removed immediately. They can remain, if required, a certain time in the postexposure unit until an operator can remove the processed plates and deliver them for further use.

A wall of the storage chamber has preferably at least one discharge port and a light beam monitoring a gap between the wall and the pallets to stop the pallet drive as long as the gap is not open. This prevents the pallets from traveling vertically while a printing plate is being moved from its position on the pallet into a discharge port. Such a pallet movement can lead to a plate jam with consequent damage to the plates. Moreover, after a short time, further movement would be blocked, which could damage the plates and the drives. A light beam can monitor all discharge ports simultaneously, because it monitors the entire gap between the pallets and the corresponding wall. This simplifies construction.

The preferred discharge port is baffled. On one hand, this prevents the escape of UV light radiation, which is a workplace hazard. On the other hand, it prevents external light from reaching the interior of the postexposure unit and adversely affecting postexposure.

For better results, the discharge port is lined preferably with high absorption surfaces. These surfaces absorb incoming and outgoing light. Reflection from either internal or external light is largely avoided.

Several discharge ports are located preferably one above the other to provide positive ejection at the last discharge port in the travel direction of the pallets. This assures that the pallets are free when they have passed the last discharge port. The plate residence time in the postexposure unit is thus limited reliably to a predetermined length.

It is also advantageous to provide some of the discharge ports with an impact edge, optionally with an intermediate receiving surface. This impact edge prevents uncontrolled slippage of the plate discharged from the apparatus.

It is also advantageous for the outer side of the last discharge port in the travel direction of the pallet to have a receiving table. The impact edge can be omitted in this case, if desired. Discharging the printing plates at this position prevents them from falling on the floor and becoming dirty.

A particularly preferred version of the apparatus has a dryer and postexposure unit arranged in series so that the orbit travels in one direction through the dryer and in another direction through the postexposure unit. This permits using both vertical sections of the orbit for processing the printing plates.

The preferred dryer has an entry and exit that can be closed. As the dryer has an elevated temperature, these closures prevent extensive heat loss. They are opened only for an incoming or outgoing plate.

The preferred dryer also has a pallet return port that can be closed. Besides the return of empty pallets, it can also block the horizontal travel section to prevent unnecessary energy loss from the dryer.

The pallets have a bearing surface comprising an air-permeable belt under a predetermined tension and at least partially elevated above a support. Such a belt can be made, for example, of a mesh of wire, textile yarns, synthetic resin filaments, or other materials. The tension and the elevation assure that air reaches the underside of the printing plates and is at least adequate to dry that side.

The belt is advantageously an endless loop and the upper leader forms the bearing surface. The pallet can be loaded and unloaded by the movement of the belt. Friction between the printing plate and the bearing surface is avoided so that the printing plates can move freely on the pallets.

A light barrier plate is placed between the upper and lower leader, essentially because of the postexposure unit. The barrier prevents a printing plate being moved out of the upper position from being exposed during the exposure of a subsequent printing plate in the postexposure unit.

A preferred version of the belt runs over at least two guide rollers to simplify loading and unloading the pallets. The drive can be, for example, through a guide roller. In this case, the printing plate must not drive the belt. Rather, the plate can be pulled onto the pallet with the aid of the belt or be shifted down by it.

At least one guide roller is provided preferably with external gear teeth that mesh with a driven, toothed belt with the aid of a coupling device. The term "toothed belt" includes all means that are belt-shaped and that can be meshed by shape or force with a gearing system, for example, chains or the like. The bearing surface of the pallet is set in motion only when the toothed belt is meshed with and driven by the guide roller, so that a printing plate can be placed on or removed from the pallet. The meshing sites can be limited to predetermined positions in the apparatus, so that the pallets are loaded and unloaded only at the predetermined positions, for example in the entrance area or at the appropriate discharge slots in the postexposure unit. An automatic drive can be provided in the postexposure unit at the last discharge port in the travel direction of the pallets.

A preferred coupling device has a movable pressure roller essentially radial to the guide roller, the pressure roller being on the side of the toothed belt away from the guide roller. The toothed belt can thus be engaged between the guide roller and the pressure roller and mesh by force or shape with the outer gear teeth of the guide roller. This assures that the guide roller has rotated through a predetermined number of revolutions for a predetermined travel length of the toothed belt. The result is that the circulating belt has also executed a predetermined movement. The increases reliability in loading and unloading the pallets. It assures that the printing plates are correctly placed on the pallet and do not extend beyond it.

Another preferred embodiment has a wall door that can be closed. It is connected with a switching device that interrupts the postexposure operation when the door is opened. This is an economical design that does not endanger operator safety. The postexposure lamp is extinguished when the door is opened. The transport motion is simultaneously interrupted. It is advantageous for the door to be a folding door.

BRIEF DESCRIPTION OF THE DRAWINGS

The invention can be more fully understood from the following detailed description thereof in connection with accompanying drawings described as follows.

FIG. 5 is a schematic view of a latch device.

FIG. 6 is a schematic view of a coupling device.

FIG. 7 is a schematic cross-section view of a dryer.

Figure 1:
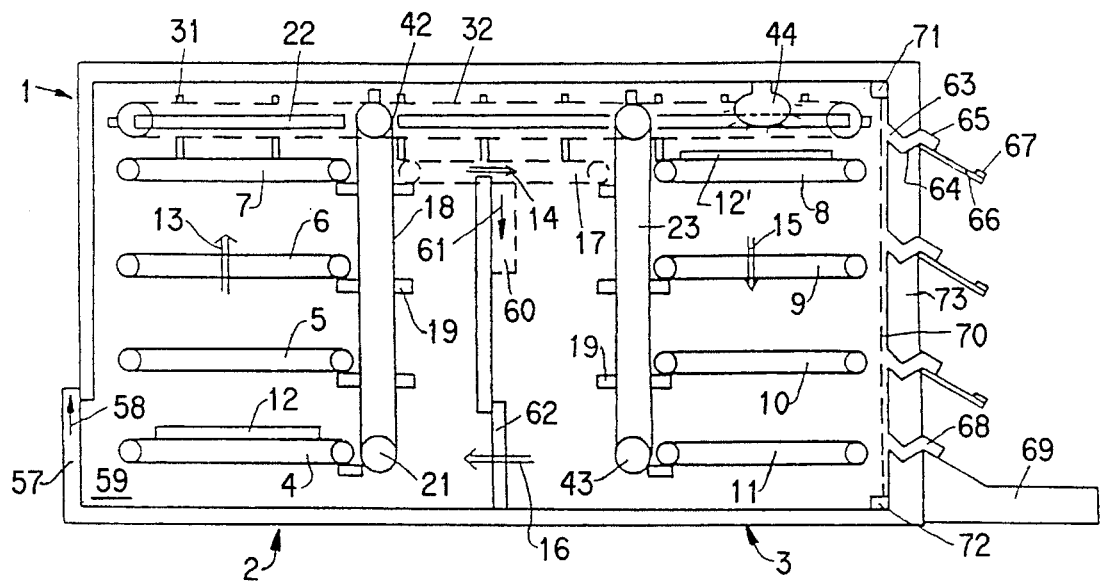
FIG. 1 is a schematic cross-section through an aftertreatment apparatus with dryer and postexposure device.

DESCRIPTION OF THE PREFERRED
EMBODIMENT(S)

Throughout the following detailed description, similar reference characters refer to similar elements in all figures of the drawings.

FIG. 1 shows a plurality of pallets 4–11 adapted to be conveyed in an orbit 13–16 which is enclosed within an apparatus 1 which has two separate sections. If, for example, the apparatus 1 includes only a dryer 2, the orbit can be closed outside the apparatus 1. In this case, the printing plates 12 are not treated in the second vertical section 15, but are only transported downward. Provision can also be made to remove the printing plates 12 from the pallet 17 at the end of the dryer 2 and to return the empty pallets 8–11 to the starting point.

Figure 2:
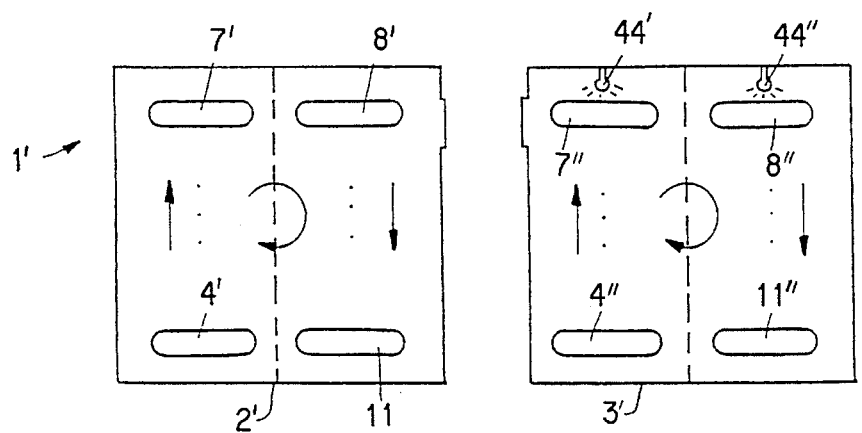
FIG. 2 is a schematic view of another embodiment.

FIG. 2 shows an alternative version of an apparatus 1' in which the dryer section 2' and the postexposure section 3' are separated from each other. In this instance, each section has a complete orbit for the pallets 4'–11' and 4"–11" respectively.

In both apparatuses 1, 1' the printing plates 12 travel essentially perpendicular to the plane of the printing plates 12 during treatment. The example in FIG. 2 shows four pallets 4'–11' for four printing plates 12. The printing plates 12 are temporarily held thus during the aftertreatment. Several printing plates 12 can be aftertreated simultaneously. This decouples plate travel during aftertreatment from the travel velocity of the plates 12 in prior process steps, which are not shown here in more detail.

The embodiment in FIG. 1 uses a linear supply method in which the individual printing plates 12 can be removed from the apparatus 1 in the sequence in which they are fed into the apparatus 1, that is, according to the first-in first-out principle. FIG. 2 shows an apparatus 1' with cyclical supply. Here a plate 12 can run through several orbits before it is removed from the apparatus 1'.

The individual sections of the orbit 13–16 have their own drives in apparatus 1. The drive for the first vertical section 13 is a circulating chain 18 on which are attached dogs 19 that laterally engage the projections 20 (FIG. 3, 4) on the pallets 4–11. For viewing, FIG. 1 shows a chain 18 only for one face side of the pallets 4–11. However, it is easy to visualize that circulating chains 18, 18' can be provided for both face sides of the pallets (FIG. 4). Chains are also provided correspondingly on both longitudinal sides of the pallets, so that the pallets are supported by their four corners during vertical travel in the first vertical section 13. The same applies to pallet travel in the second vertical section 15. The chains can be controlled, for example, by a guide roller 21.

A U-shaped track 22, open to admit the pallets, is provided for horizontal travel in the first horizontal section 14, as shown in detail in FIG. 4. This U-track 22 forms a guide that is interrupted by the vertical drives, specifically the chains 18 and 23 for the postexposure device 3. The U-track 22 can be interrupted similarly for the chains, not shown, on the other sides of the pallets.

Figure 3:
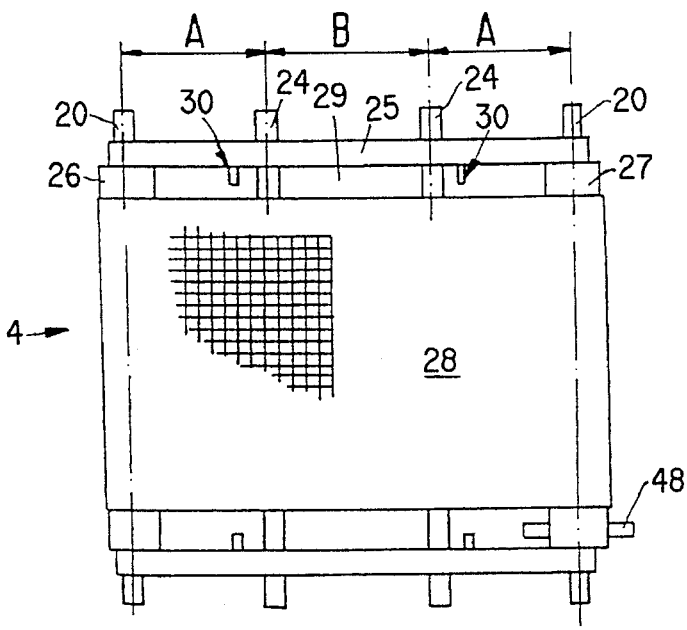
FIG. 3 is a top view of a pallet.
Figure 4:
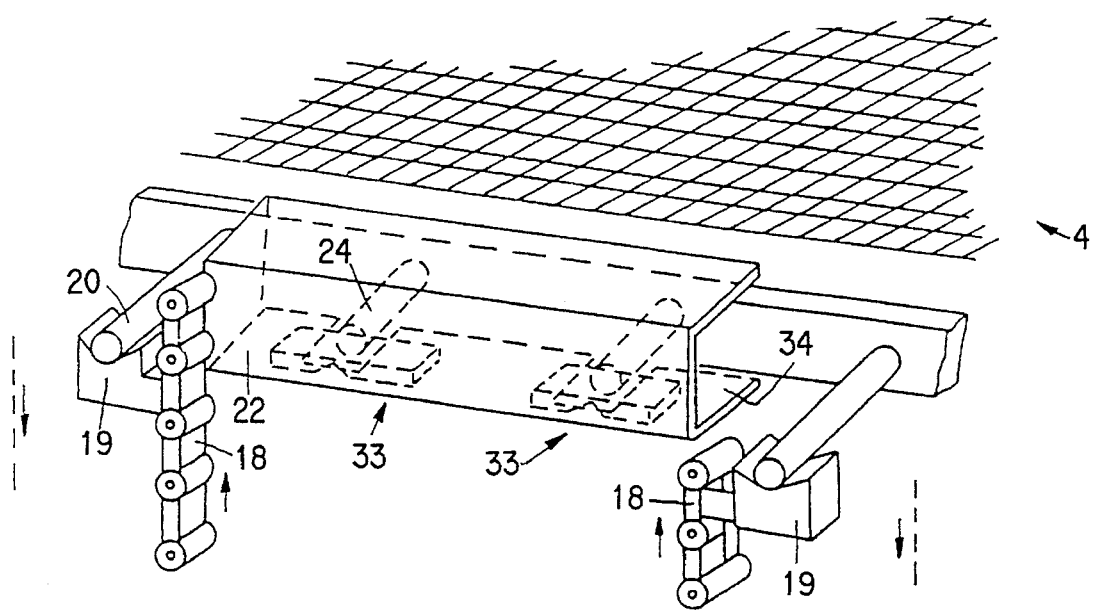
FIG. 4 is a schematic view of the guide for the pallet in the horizontal and vertical direction.

As can be seen in FIG. 3, each pallet 4 has, in addition to the projections 20, other projections 24 that engage the vertical drive 18, 19. The projections 20 and 24 extend outward from a carrier 25 that bridges the two ends formed by the guide rollers 26, 27. Between the carrier 25 and the bearing surface formed by an endless belt 28 consisting of a circulating wire netting is an intermediate space 29 into which extend projections 30 attached to the carrier 25. Dogs 31 attached to the chain 32 shown by broken lines in FIG. 1 mesh with these projections 30. The chain 32 forms a horizontal drive to move horizontally the pallet 4 picked up in the U-track by its projections 20, 24.

To guide the pallet into the U-track, the U-track 22 has a latch mechanism 33 in the area of the projections 24, as shown in FIG. 4 and in more detail in FIG. 5. For clarity, FIG. 5 shows only the inner surface 34 of the U-track 22. This inner surface 34 is broken by a gap 35. The gap 35 is filled by two latches 36, 37, each having a flat surface 38 coplanar with the inner surface 34 and bounded below by a bevel 39. The surface 38 extends in a finger 40 that fits into a corresponding recess 41 in the inner surface 34 of the U-track 22. This assures that even with the greatest deviation of the latches 36, 37 from the U-track 22, that is, in the case shown in FIG. 5, an overlap is maintained between the finger 40 and the inner surface 34. Conversely, the finger 40 can extend completely into the recess 41.

When the pallet 4 is conveyed vertically upward with the aid of chains 18, 18' the projections 24 contact the bevels 39 of the latches 36, 37. Further movement of the chains 18, 18' pushes both latches 36, 37 right and left into the track and creates an opening through which the projections 24 reach the interior of the U-track. As soon as the projections 24 have passed the latch mechanisms 33, the latches 36, 37, which are spring-loaded for this purpose, reclose. The projections 24 can now rest on the surfaces 38 of the latches 36, 37. A continuous flat surface is formed by the inner surface 34 of the U-rail or track 22 as a result of the overlap between the finger 40 and the inner surface 34. The projections 24 can slide horizontally on this surface without catching in any notches.

The dogs 19 have a V-shaped or U-shaped cross section. The projections 20 are essentially cylindrical, that is, their deepest point is about in the middle, viewed in the travel direction. When the projections 20 are engaged by the dogs 19, the projections 20 slip into the deepest position on the dogs 19 and are held there securely. The dogs 19 can be moved downward only with considerable force.

The guide roller 21 is reversible, mainly to enable horizontal travel. After the projections 24 have passed the latch mechanisms 33, the travel direction of the chains 18, 18' is reversed momentarily, long enough to free the projections 20 from the dogs 19. As soon as the projections 20 are free from the dogs 19, the movement of the chain 18 can be stopped and the pallet can be moved horizontally with the aid of the chain 32. Thus, the projections 20 reach the U-track 22 and can be easily conveyed horizontally, because the latch mechanisms 33 are closed.

The chain 32 and the chains 18, 23 are offset from each other parallel to the plane of FIG. 1. This becomes clear in FIG. 3. The chain 32 runs above the projections 30, whereas the chains 18, 23 are positioned above the projections 20.

As the U-track is interrupted by the chains 18, 23, the resulting gaps must be taken into account in the horizontal travel of the pallet 4. As the pallet 4 travels from left to right (FIG. 3), the right projection 20 arrives first at the gap 35. The pallet 4 cannot be inclined, because the other projections 24 or the left projection 20 are held in the U-track. If the diameters of the projections 20, 24 fit the U-track section, the passage of the right projection 20 through the gap 42 does not significantly change the orientation of the pallet 4. The projections 20, 24 are arranged so that two of the projections are always guided in the U-track 22. Either these two projections 20, 24 hold the pallet by opposing its tilt moment or they hold the pallet by supporting it on both ends.

A similar latch mechanism 33 can be provided for descending pallets in the postexposure unit 3. As this latch mechanism cannot be controlled by the projections 24, it can be made externally controllable with the aid of a piston and cylinder device to open and close the latches 36, 37. Because the horizontal travel in the first horizontal section 14 is followed by descent in the second vertical section 15, such a latch mechanism 33 is not necessarily required in the post-exposure unit 3. In any event, the projections 20 and 24 must be spaced apart so that the projections do not fall unintentionally through the gaps 35. For this reason, the spacing A between the two outer projections 20 and the next inner projections 24 is different from the spacing B of the inner projections 24 from each other. This produces a type of lock and key system. The correct position is reached only when each projection 20, 24 is not impeded by the U-track 22. This results from the different spacings A, B but only in a single position.

The chain 23 is controlled with the aid of the guide roller 43 so that the dogs 31 engage the projections 20 at a position that essentially locks with the inner surface 34 of the U-track 22. The chain 32 forwards the pallet 4 until it drops onto the dogs 31 of the chain 23. This drop is decidedly short because of the positioning of the dog 31 and is in the order of a few millimeters. After the pallet comes to rest on the dogs 31, it can be conveyed downward in the direction of the arrow 15, optionally after a certain residence time for postexposure.

The second horizontal travel section 16 similarly has a U-track, not shown in detail, to fulfill the same function as the U-rail 22, namely to prevent the pallet 4 from tipping, when it must be conveyed past the gaps necessitated by the vertical drive. As this U-track must be entered only from above, the latch mechanisms can be omitted. It is only necessary to provide upper notches through which the projections 24 can enter. The U-track in the area of the projections 20 has gaps like the U-track 22.

The postexposure unit 3 has a light source 44 that emits light with two characteristic spectral lines. One is light in the UV-A range, that is, about 370 nm, that completely polymerizes the material in the printing plate 12, and the other is UV-C, that is, about 250 nm, to eliminate residual tackiness in the printing plate 12. The two wavelengths can be emitted simultaneously. However, it is simpler to operate the light source 44 in two steps, for example, at different energy levels, to emit the two spectral ranges successively.

As shown in FIG. 2, two light sources 44',44" can be provided to emit the appropriate spectral range.

Exposure is conducted only in the postexposure unit 3 and in the top position. As soon as the pallet descends and a new pallet is transported into the top position, the printing plate in the second from the top position is no longer exposed. For this purpose, each pallet has a light barrier plate 45. This plate 45 is placed between the upper leader 46 and the lower leader 47 of the circulating light-permeable and air-permeable belt 28 (FIG. 6).

The belt 28 can be driven by the guide roller 27 to load and unload the pallet. The guide roller 27 has outer gear teeth 48. At the points where the belt 28 is to be driven, a coupling device 49 is provided. It can mesh a circulating toothed belt 50, which is driven by a motor 51, with the gear teeth 48 of the guide roller 27. For this purpose, the coupling device 49 has a piston and cylinder device 52 that presses a pressure roller 53 in direction of arrow 54 against the toothed belt 50 from the side away from the guide roller 27. The toothed belt 50 is thus gripped between the guide roller 27 and the pressure roller 53. When the toothed belt 50 is driven in the direction of the arrow 55, the upper leader 46 of the belt 28 consequently moves in the direction of the arrow 56. A printing plate on the belt would be transported either onto or away from the pallet.

Placing the coupling devices 49 only where the pallets 4 are to be loaded or unloaded assures that loading or unloading the pallets does not take place elsewhere. The toothed belt 50 obviously passes by the corresponding coupling devices 49. The toothed belt 50 does not have to run constantly. It suffices to drive it as long as the coupling device 49 is actuated.

The apparatus 1 is loaded when the pallet 4 is in the lowest position of the dryer 2. For this purpose, a sliding door 57 is moved upward in the direction of the arrow 58 to open an aperture 59 through which a printing plate 12 can be transported on the lower conveyor belt 4. Heat can escape from the dryer only as long as the aperture 59 is opened by the sliding door 57.

Another sliding door 60 is located between the dryer 2 and the postexposure unit 3. This door 60 is moved downward in the direction of the arrow 61 when a pallet is moved from the dryer 2 into the postexposure unit 3, as shown by the pallet 17. The sliding door 57 can remain closed at this time. The sliding door 60 remains open only as long as required for the transfer of the pallet 17. The sliding doors 57 and 60 thus serve to load and unload the dryer 2. Empty pallets are returned through a sliding door 62, which can be moved upward in the example of FIG. 1 for a pallet return aperture between the dryer 2 and the postexposure unit 3.

The pallets are moved vertically only when either a place at the top of the dryer has become available as a result of a pallet moving horizontally into the first horizontal section 14 to make room at the lowest position for an empty pallet to receive an untreated printing plate 12 or to control the aftertreatment time. Otherwise, the pallets remain in the standby positions shown in FIG. 1. The aftertreatment is thus conducted on essentially immobile printing plates 12.

Because postexposure in the postexposure unit 3 shown in FIG. 1 is conducted only in the topmost position occupied here by pallet 8, the printing plates can be withdrawn in each position from pallets 8–11. A coupling device 49 as shown in detail in FIG. 6 is provided at each of the positions shown. When the printing plate 12' is unloaded by movement of the circulating belt 28, it arrives at a slot-like, baffled, discharge port 63. Its walls are lined with high absorption material, that is, for low reflection. This prevents the escape of UV light from the light source 44. It also prevents exterior light from reaching the interior of the postexposure unit 3 and disturbing the aftertreatment process. The discharge port 63 is joined to a small receiving plate 66 ending in an impact edge 67. The impact edge 67 prevents the discharged plate from falling out of control.

A corresponding discharge port 63 is provided similarly for each position. The last discharge port in the travel direction of the pallets, that is, discharge port 68 next to pallet 11, does not have a receiving plate 66 and the impact edge 67. It has instead a receiving table 69.

The pallet 11 is automatically unloaded in the lowest position. As soon as a pallet 11 moves into the lowest position, a coupling device 49 there is actuated and the motor 51 is switched on until the belt 28 has passed through half a revolution. This assures that only empty pallets are transported back into the dryer 2. This reliably excludes a collision between a newly inserted printing plate 12 and a printing plate 12 already on a pallet. The receiving table 69 is large enough to accept each treated plate without it falling to the floor.

A light beam 70 with an emitter 71 and a receiver 72 prevents the pallets 8–11 from moving while a printing plate is being unloaded. The beam monitors the gap between the pallets 8–11 and the wall 73 with the discharge ports 63, 68. The drive roller 43 for the pallets 8–11 is blocked while the light beam 70 is interrupted.

FIG. 7 shows schematically a front view of the interior design of the dryer 2. The dryer 2 has a drying chamber 74 enclosed by the doors 75, 76 on two opposite sides. The doors 75, 76 are sealed against the housing 77 by gaskets. The lower part of the housing 77 and the doors 75, 76 form a flow path for the drying air. This air flow is produced by a fan 79 that circulates the air and optionally, heats it. Recirculated air is also used for drying. Because the air eventually becomes loaded with materials from the printing plates 12, a sensor 80 is provided to measure the content of these materials in the air and to control, as a function of this content, the addition of fresh air through an air inlet 81. Excess air is released through an air outlet 82 after having been purified in a cleaning device 83. Only purified air is released to the atmosphere, thus minimizing odor and environmental damage.

The air inlet 81 and the air outlet 82 can be directly connected together. In this case, the purification device 83 functions in the bypass operation.

The air flow indicated by arrows circulates out of the door 76 through the exit slots 84 and through the entrance slots 85 into the door 75. The openings of the exit slots 84 and of the entrance slots 85 can be adjusted with shutters 86, which can be pivoted for this purpose. The openings of the exit slots 84 and the entrance slots 85 are adjusted so that an approximately equal amount of air overall flows from the exit slots 84 due to the flow resistance through all of the slots as adjustable by the size of the openings. Drying is accomplished under essentially uniform conditions regardless of the location of the individual pallets. The flow resistances at the individual exit slots 84 are selected as a function of the distance from the fan 79. The greater the distance from the fan 79, the smaller the flow resistance should be to assure a uniform air exit from all exit slots 84 and a correspondingly uniform air entrance into all entrance slots 85.

The air exit slots 84 and the air entrance slots 85 are configured to produce an air flow 87 directed essentially between the pallets 4–7 in the standby position shown. This permits either attaining high flow velocities or minimizing energy expenditure to produce the air flow, because the pallets themselves cause little or no air turbulence.

A variation of the example shown can also be provided by having the air blown into the drying chamber 74 from two different directions. In this instance, the air streams can arrive alternately from one or the other side of the drying chamber 74 so that separate circulations can form in the drying chamber.

The embodiments shown can be varied in many aspects. In particular, more than the four pallets shown can be superposed. The vertical and horizontal drives can be other than chains, for example, latch drives or linear drives. After-treatment devices in addition to the dryer and postexposure unit can also be used, with the pallets being conveyed by the same transport principle. The printing plates can also be treated during their horizontal travel.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. Apparatus for the aftertreatment of photopolymerizable printing plates comprising means for generating an environment with at least one predetermined condition and a transport device to support plates during transport and to transport the plates through the apparatus, characterized in that the transport device has more than one pallet (4–11, 17; 4'–11'; 4"– 11") for printing plates (12, 12") that are conveyed in an orbit at least sectionwise through the environment, wherein each of the pallets (4–11,17) is borne on a bearing surface of an air-permeable belt (28) held at a predetermined tension and at least partially elevated above a support.

2. The apparatus according to claim 1, characterized in that each orbit of the pallets comprises more than one straight line, which is essentially a vertical or horizontal section (13–16).

3. The apparatus according to claim 1, characterized in that the pallets (4–11, 17; 4'–11'; 4"–11") essentially maintain their spatial alignment during an entire orbit (13–16).

4. The apparatus according to claim 1, characterized in that the pallets are transported along an orbit inside the apparatus (1).

5. The apparatus according to claim 2, characterized in that the transport device comprises separate drives (32; 18, 23) for the horizontal (14, 16) and vertical (13, 15) sections.

6. Apparatus for the aftertreatment of photopolymerizable printing plates comprising means for generating an environment with at least one predetermined condition and a transport device to support plates during transport and to transport the plates through the apparatus, characterized in that the transport device has-more than one pallet (4–11, 17; 4'–11'; 4"–11") for printing plates (12, 12") that are conveyed in an orbit at least sectionwise through the environment, each orbit of the pallets comprises more than one straight line, which is essentially a vertical or horizontal section (13–16), the transport device comprises separate drives (32; 18, 23) for the horizontal (14, 16) and vertical (13, 15) sections, and the drives have circulating belts (18, 23; 32) on which are attached dogs (19, 44; 31) that interact with lateral projections (20, 30) on the pallets (4).

7. The apparatus according to claim 6, characterized in that the pallets (4) moving in the horizontal sections (14, 16) are conveyed with their projections (20, 24) into a guide (22) interrupted by the drives (18, 18', 23) for the vertical sections (13, 15), at least three of the projections (20, 24) are provided, and the guide (22) accepts a tilt moment.

8. The apparatus according to claim 7, characterized in that the guide (22) has a U-shaped profile fitting opposite sides of the pallet (4).

9. The apparatus according to claim 7, characterized in that the guide (22) for an upper horizontal section (14) has a latch mechanism (33) that opens as the projections (24) pass and closes after the projections (24) have passed.

10. The apparatus according to claim 9, characterized in that each pallet side has two latch mechanisms (33) and two of the interfitting projections (24) between which is the pallet's center of gravity.

11. The apparatus according to claim 9, characterized in that the vertical drive (18, 18') is reversible and has a control that momentarily reverses the vertical drive after the projection (24) has passed the latch mechanism (33).

12. The apparatus according to claim 6, characterized in that each one of the vertical drives has at least two dogs (19, 19') for each pallet side, the dogs having a V-shaped cross-section, and the projections (20) have a cross-section with its lowest point about in the horizontal center.

13. The apparatus according to claim 10, characterized in that the latch mechanisms (33) have at least one bevel (39) against which the projection (24) exerts pressure.

14. The apparatus according to claim 9, characterized in that more than three of the projections (20, 24) are located on each pallet side with spacings (A) between the outer projections (20) and the next inner projections (24) being different from other spacings (B) of the projections (24).

15. The apparatus according to claim 6, characterized in that the pallet (4) has a lateral bar (25) with an intermediate space between it and the pallet, on which are located two sets of projections (20, 24; 30), one set (20, 24) projecting outward from the bar (25) and the other set (30) projecting inward.

16. The apparatus according to claim 15, characterized in that the inward projections (30) interact with the horizontal drive (32, 33).

17. The apparatus according to claim 6, characterized in that the vertical drive (23) for descending pallets has a control that holds the dogs (31) about at the top of the guide during the horizontal travel of the pallets and initiates descent only when the projections mesh with the corresponding dogs (31).

18. The apparatus according to claim 9, characterized in that a top side of the latch mechanism (33) forms a sliding surface (34) with the guide (22).

19. The apparatus according to claim 18, characterized in that the latch mechanism (33) has a latch (36, 37), an upper side (38) of which is accepted finger-like (40) within the guide (34).

20. The apparatus according to claim 1, characterized in that the generating means comprises a dryer (2) with a drying chamber (74) that can be closed off by doors (75, 76).

21. The apparatus according to claim 20, characterized in that the dryer (2) has an air flow generator (79) that circulates air (87) lateral to the pallets (4–7).

22. The apparatus according to claim 21, characterized in that doors (75, 76) form a path for the air flow.

23. The apparatus according to claim 22, characterized in that the doors have air exit slots (84, 85) at predetermined levels, the slots (84, 85) having variable flow resistances of magnitudes determined by the distance from a fan (79) producing the air flow (87), and particularly with equal air exit velocities from all air exit slots (84, 85).

24. The apparatus according to claim 23, characterized in that the air exit slots (84, 85) are adjustable.

25. The apparatus according to claim 23, characterized in that the air exit slots (84, 85) are located between standby positions of the pallets (4–7).

26. The apparatus according to claim 21, characterized in that the air flow is recirculated air, and the air content of materials from the printing plates (12) is measured by a sensor (80) that controls fresh air additions accordingly.

27. The apparatus according to claim 21, characterized in that an exhaust air purification device (83) is adapted to purify the air before it is released to the atmosphere.

28. Apparatus for the aftertreatment of photopolymerizable printing plates comprising means for generating an environment with at least one predetermined condition and a transport device to support plates during transport and to transport the plates through the apparatus, characterized in that the transport device has more than one pallet (4–11, 17; 4'–11'; 4"–11") for printing plates (12, 12") that are conveyed in an orbit at least sectionwise through the environment, and the generating means comprises a postexposure unit (3) having, in a storage chamber, a light source for a predetermined spectrum that can be varied with respect to time.

29. The apparatus according to claim 28, characterized in that a wall (73) of the storage chamber has at least one discharge port (63, 68), and a light beam monitoring a gap between the wall (73) and the pallets (8–11) stops the drive as long as the gap is obstructed.

30. The apparatus according to claim 1, characterized in that the generating means comprises a series configuration of a dryer (2) and a postexposure unit (3) with the pallets adapted to be conveyed in one direction through the dryer (2) and in another direction through the postexposure unit (3).

31. The apparatus according to claim 30, characterized in that at least the dryer (2) has an inlet and an outlet, both of which can be closed.

32. The apparatus according to claim 31, characterized in that the dryer (2) has a pallet return opening that can be closed.

33. The apparatus according to claim 1, characterized in that the belt (28) is an endless loop and the bearing surface is an upper leader (46).

34. The apparatus according to claim 33, characterized in that a light barrier plate (45) is located between the upper leader (46) and a lower leader (47).

35. The apparatus according to claim 33, characterized in that the belt (28) is passed over at least two guide rollers (26, 27).

36. The apparatus according to claim 35, characterized in that at least one guide roller (27) has outer gear teeth (48) that can mesh with a drivable toothed belt (50) with the aid of a coupling device (49).

37. The apparatus according to claim 36, characterized in that the coupling device (49) has a pressure roller (53) that can be shifted essentially radially to the guide roller (27), and the pressure roller (53) is located on the side of the toothed belt (50) away from the guide roller (27).

38. The apparatus according to claim 29, characterized in that the wall (73) has a door connected to a switching device that stops the operation at least of the postexposure unit (3) when the door is opened.

39. The apparatus according to claim 38, characterized in that the door is a folding door.

* * * * *